United States Patent [19]

Vogt et al.

[11] Patent Number: 6,018,144

[45] Date of Patent: *Jan. 25, 2000

[54] METHOD OF CONVEYING MOIETIES THROUGH AN IR CONVEYOR FURNACE WITH CONTROLLED TEMPERATURE PROFILE FOR LARGE AREA PROCESSING MULTICHIP MODULES

[75] Inventors: Lester H. Vogt, Trabuco Canyon; Douglas A. Bolton, Foothill Ranch, both of Calif.

[73] Assignee: Radiant Technology Corporation, Fullerton, Calif.

[ * ] Notice: This patent is subject to a terminal disclaimer.

[21] Appl. No.: 09/197,176

[22] Filed: Nov. 20, 1998

Related U.S. Application Data

[63] Continuation of application No. 08/746,966, Nov. 18, 1996, Pat. No. 5,864,119, which is a continuation of application No. 08/582,651, Jan. 4, 1996, abandoned
[60] Provisional application No. 60/006,459, Nov. 13, 1995.

[51] Int. Cl.[7] ................... F27B 9/24; F27B 9/36
[52] U.S. Cl. ................ 219/388; 219/411; 392/411
[58] Field of Search ............................ 219/388, 390, 219/411, 494; 392/411, 416–418; 228/178, 180.22; 156/380.9; 432/11, 121, 152

[56] References Cited

U.S. PATENT DOCUMENTS

| 3,956,612 | 5/1976 | Ballard et al. | 392/417 |
|---|---|---|---|
| 4,015,558 | 4/1977 | Small et al. | 118/729 |
| 4,169,007 | 9/1979 | Pray | 156/380 |
| 4,460,821 | 7/1984 | Crain et al. | 219/388 |
| 4,508,960 | 4/1985 | Arai | 219/388 |
| 4,517,448 | 5/1985 | Crain et al. | 219/388 |
| 4,565,917 | 1/1986 | Furtek | 219/388 |
| 4,574,182 | 3/1986 | Pescatore et al. | 219/388 |
| 4,832,249 | 5/1989 | Ehler | 228/102 |
| 4,924,073 | 5/1990 | Chiba | 219/413 |
| 4,927,487 | 5/1990 | Gelinas et al. | 156/380.9 |
| 5,135,685 | 8/1992 | Masuhara et al. | 264/406 |
| 5,155,336 | 10/1992 | Gronet et al. | 219/411 |
| 5,268,989 | 12/1993 | Moslehi et al. | 392/418 |
| 5,323,485 | 6/1994 | Josefsson et al. | 392/417 |
| 5,413,164 | 5/1995 | Teshima et al. | 165/11.1 |
| 5,429,498 | 7/1995 | Okase et al. | 432/152 |
| 5,444,815 | 8/1995 | Lee et al. | 392/416 |
| 5,485,985 | 1/1996 | Eppeland et al. | 266/87 |
| 5,831,248 | 11/1998 | Hojyo et al. | 219/388 |
| 5,864,119 | 1/1999 | Vogt et al. | 219/388 |

FOREIGN PATENT DOCUMENTS

WO9305353 3/1993 WIPO .

Primary Examiner—Joseph Pelham
Attorney, Agent, or Firm—Christie, Parker & Hale, LLP

[57] ABSTRACT

A method of conveying moieties through an infrared conveyor furnace with controllable point source radiation elements incorporating a clean room internal environment. The method comprises the steps of transporting moieties in an indexed manner through multiple heating zones heated by arrays of lamps; and dividing the lamps of each array into a plurality of groups which are separately controlled to maintain a constant temperature across the surface of the moiety. The method further comprises controlling the lamp groups through the use of a controller utilizing data from FTIR sensors mounted in a fused quartz barrier which is permeable by infrared radiation but which seals the lamp arrays from the heating zones.

8 Claims, 6 Drawing Sheets

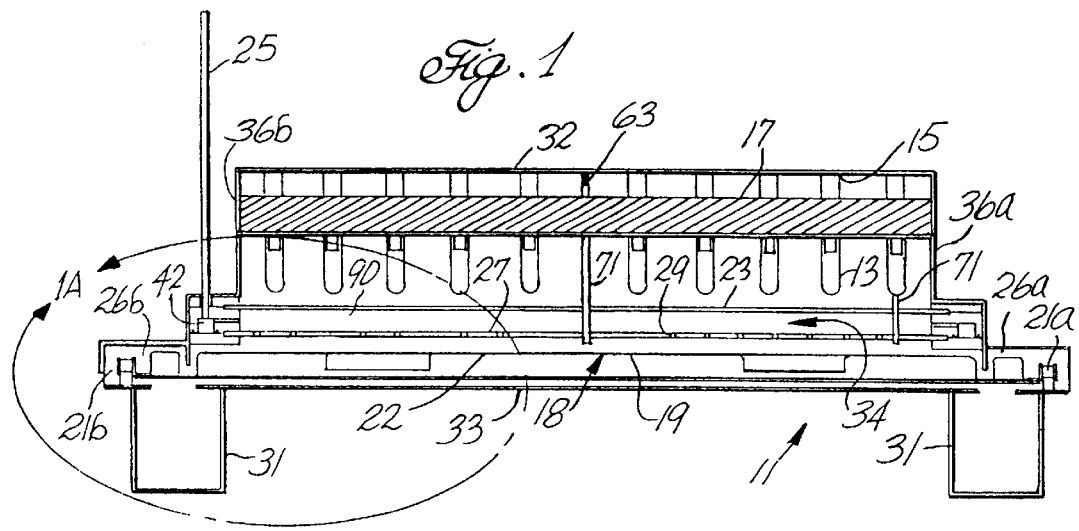
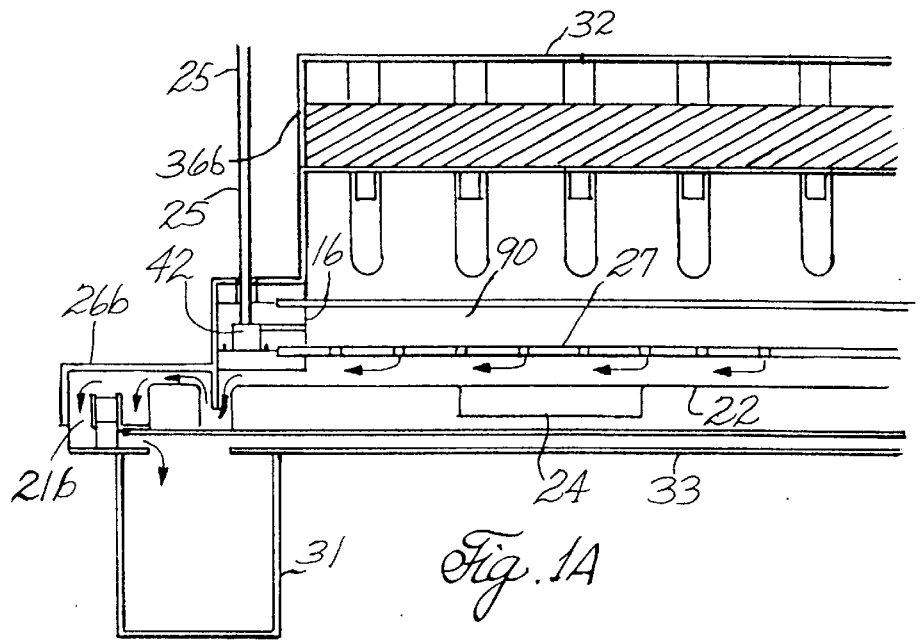

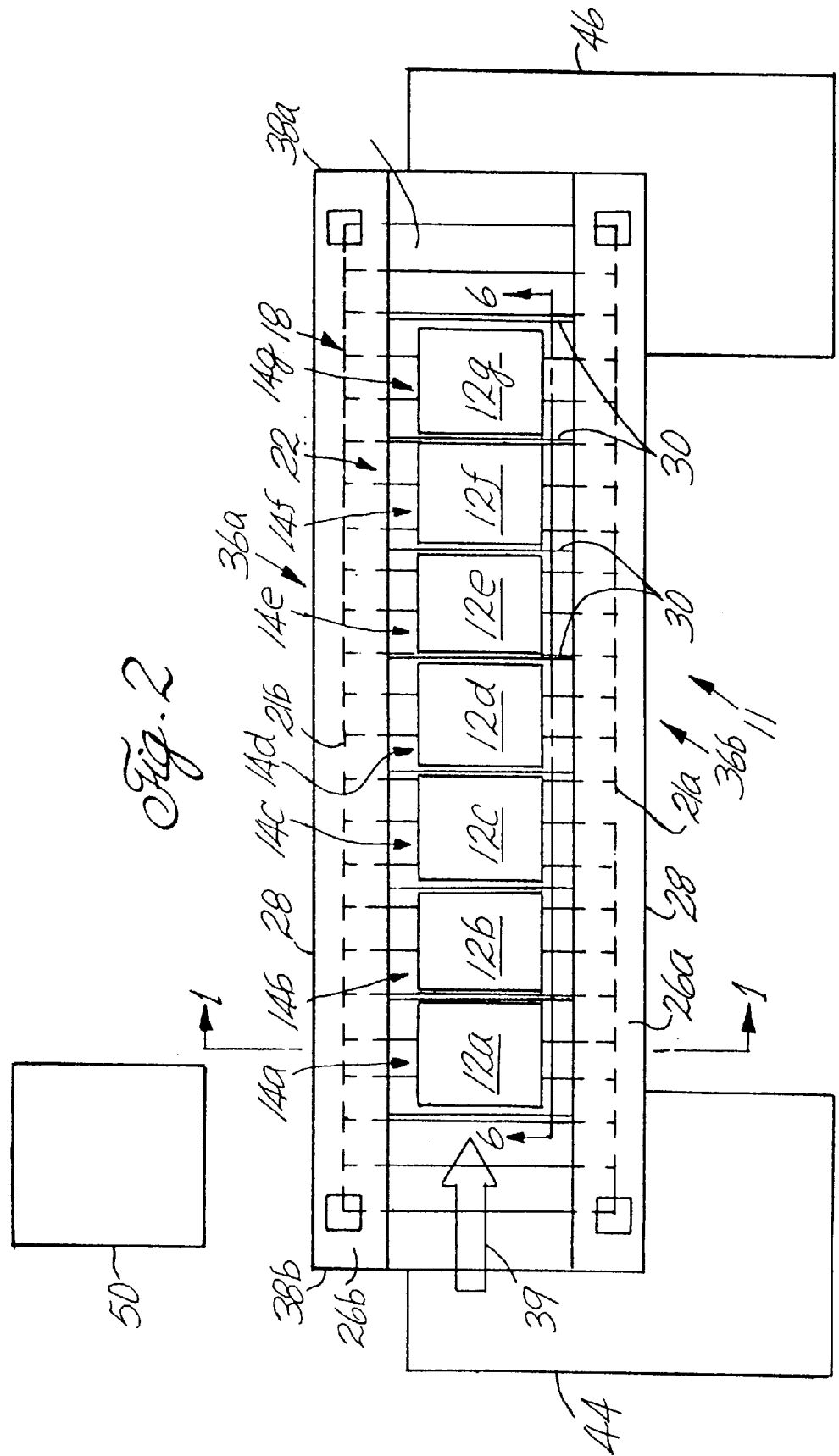

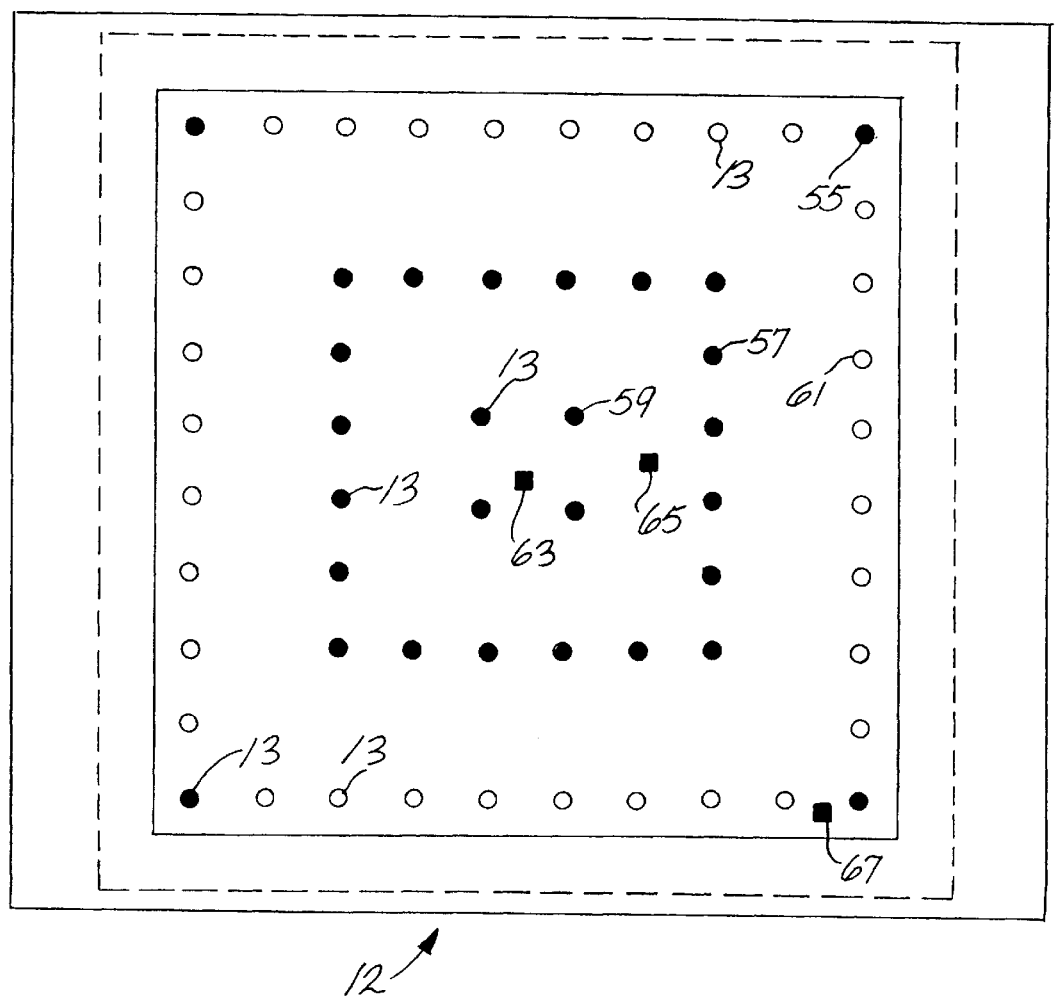

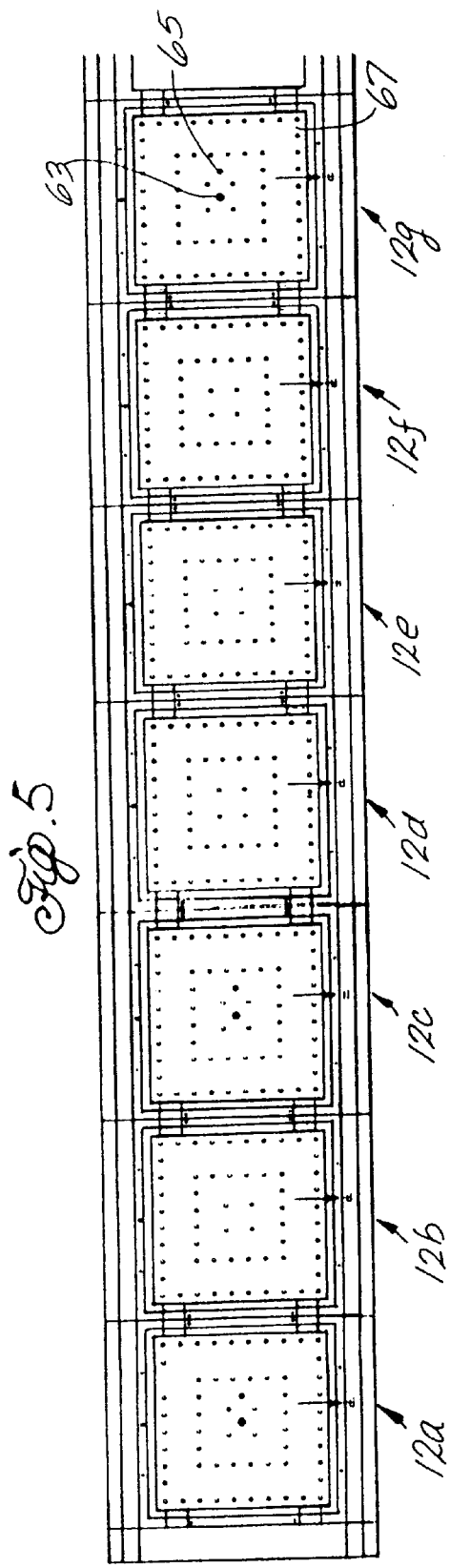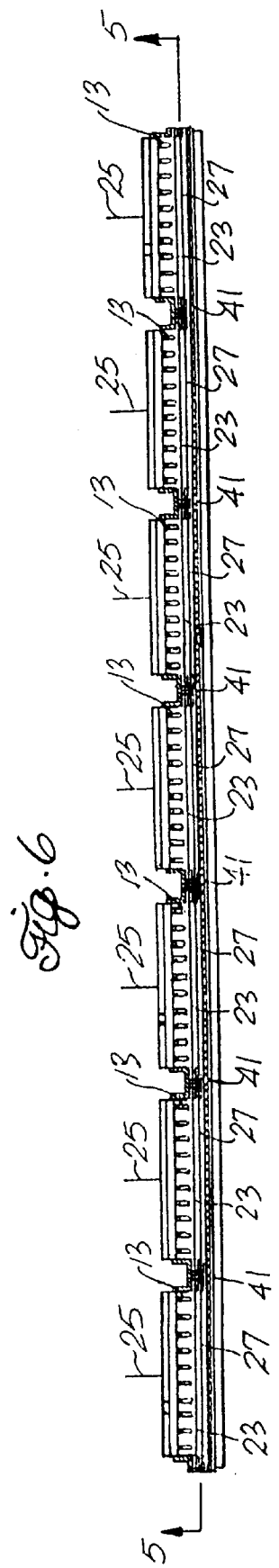

METHOD OF CONVEYING MOIETIES THROUGH AN IR CONVEYOR FURNACE WITH CONTROLLED TEMPERATURE PROFILE FOR LARGE AREA PROCESSING MULTICHIP MODULES

CROSS REFERENCE TO RELATED APPLICATIONS

This application is a continuation of allowed Application No. 08/746,966 filed Nov. 18, 1996, which claimed the benefit of the filing date of U.S. Provisional Application No. 60/006,459 filed Nov. 13, 1995 and of U.S. patent application Ser. No. 08/582,651 filed Jan. 4, 1996, the disclosures of which are incorporated fully herein by reference.

GOVERNMENT LICENSE RIGHTS

The invention was made with government support under Agreement MDA 972-94-3-0019 with the Advanced Research Projects Agency, and the United States government may have limited rights in this invention.

FIELD OF THE INVENTION

The present invention relates to method of thermal curing. The invention specifically relates to a method of curing through a large-format, low particulate, controlled-atmosphere rapid thermal curing furnace.

BACKGROUND OF THE INVENTION

Conventional IR and near IR furnaces use linear quartz-halogen-tungsten lamps as their heat source. Such furnaces may be employed for a variety of processing applications such as brazing or lid sealing, as well as for integrated circuit packaging applications.

These furnaces may achieve a minimum temperature gradient of approximately ±2° C. across a conveyor belt up to several feet in width. Much larger gradients, however, are observed across the surface of items, or moieties, transported on the conveyor belt. The greater temperature gradient across the surface of a moiety is related to the geometry of the moiety, the emissivity and thermal conductivity of the moiety, and other physical parameters that pertain to the absorption of radiant energy by the moiety. These larger gradients may affect moiety yield in some state-of-the-art processes.

In particular, a lack of a uniform temperature across the surface of a moiety may have a negative impact on the production of multichip modules. A typical integrated circuit package is comprised of a single chip. In a multichip module several chips are placed on a substrate material that may be approximately 24"×24" to form a single package. A multichip module typically has several layers of an organic dielectric, which may be benzocyclobutene (BCB), sandwiching metallized layers of submicron etching that provide connections for the chips placed on the module. If the organic dielectric layers are not uniformly cured the layers of the organic dielectric may delaminate, thereby affecting the reliability of the module.

Moreover, monitoring, or process control, of the curing process typically involves the use of the statistical methods at aggregate levels. These methods do not allow for individualized moiety monitoring and control, and thus limits total moiety curing yield.

Additionally, near-infrared furnaces are often not constructed to provide ultra-clean environments within the heated. chambers. In some state-of-the-art processes, however, particulate contamination is a factor. Particulates in the micron or submicron range can contaminate semiconductor applications, thereby reducing part reliability and yield. Particulate contamination of the furnace atmosphere can arise from several sources. These sources include furnace insulation, friction due to a conveyor assembly or contacting movement of items within the furnace, and from particulates present in the source atmosphere.

SUMMARY OF THE INVENTION

The present invention provides a method for conveying items, or moieties through a IR conveyor furnace with a low particulate two dimensional controlled temperature heating area. The method for processing moieties comprises the steps of transporting a moiety on a conveyor system through a heating area; energizing a plurality of heating elements having IR lamps in the heating area to apply heat to the moiety; sensing the surface temperature of the moiety in the heating area at a plurality of locations through aiming a plurality of infrared sensors to detect the temperature on the surface of the moiety at those locations; individually controlling the groups of heating elements responsive to the surface temperatures sensed at the plurality of locations to minimize the surface temperature gradient across the moiety in the heating area; interposing a particulate barrier permeable to infrared radiation between the heating elements and the heating areas to prevent particulate contamination associated with the heating elements from reaching the moieties; and indexing the conveyor motion between heating areas.

Another method for processing moieties comprising the steps of receiving a plurality of moieties in a first clean area; transferring the moieties from the first clean area to a conveyor system operatively coupled to the first clean area; transporting the moieties on the conveyor system through a plurality of heating zones; energizing a plurality of separately controllable heating elements having IR lamps in each heating zone to apply heat to the moieties; interposing a particulate barrier permeable to near infrared radiation between the heating elements and the conveyor system; and transferring the moieties from the conveyor system to a second clean area operatively coupled to the conveyor system.

Many of the attendant features of this invention will be more readily appreciated as the same becomes better understood by reference to the following detailed description and considered in connection with the accompanying drawings in which like reference symbols designate like parts throughout.

BRIEF DESCRIPTION OF THE DRAWINGS

FIG. 1 is a cross sectional view of an embodiment of an IR furnace of the present invention through a plane 1—1 illustrated in FIG. 2.

FIG. 1A is a partial enlargement of FIG. 1 illustrating the gas flow path.

FIG. 2 is a top schematic view of the IR furnace of FIG. 1.

FIG. 3 is a plan view of a lamp array of the IR furnace of FIG. 1 illustrating the lamp arrangement and sensor location.

FIG. 5 is bottom sectional view of the lamp arrays of the IR furnace of FIG. 1 illustrating the lamp arrays.

FIG. 6 is a side sectional view of the IR furnace of FIG. 1.

DETAILED DESCRIPTION

Figure 4:
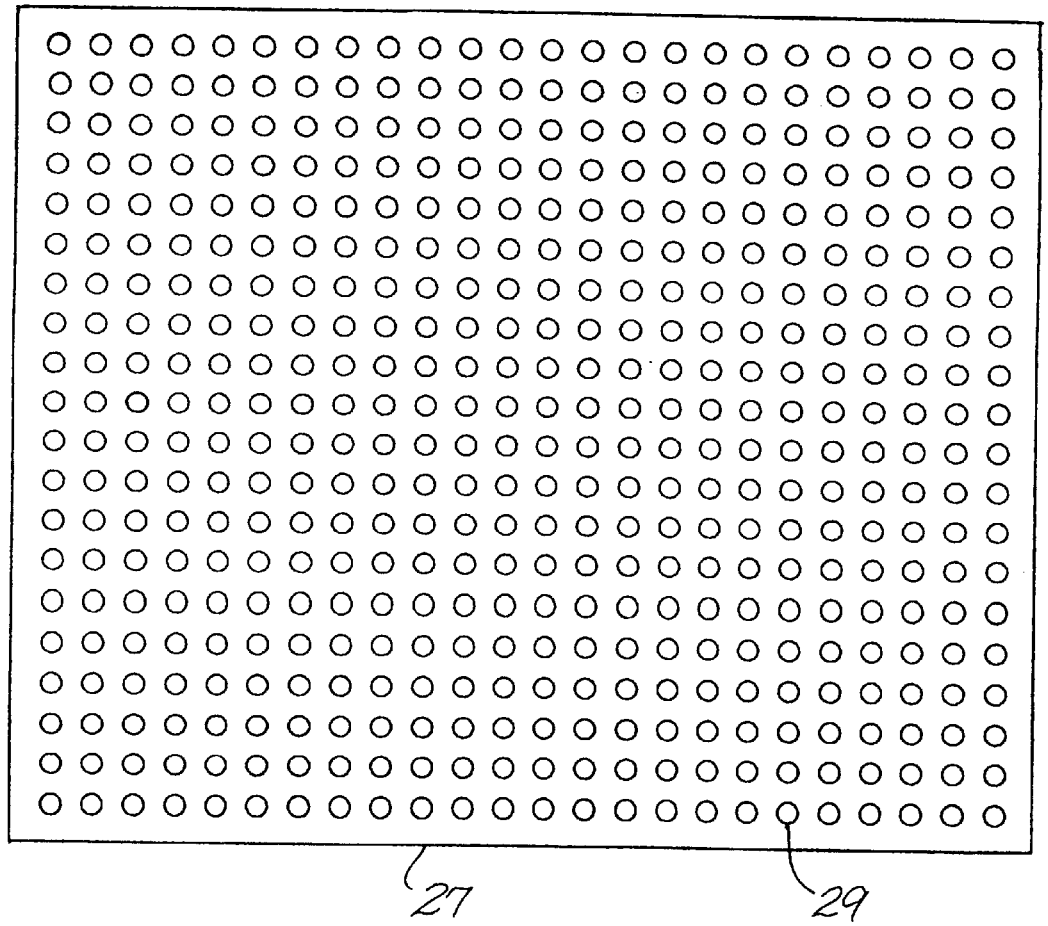
FIG. 4 is a plan view of the perforated barrier of the IR furnace of FIG. 1.

Referring now to the drawings, a furnace 11 of the present invention is shown in FIG. 1. Except for product entrance and exit openings and gas introduction and escape openings described below, the furnace 11 is an enclosed structure having a top 32, a bottom 33, longitudinal sides 36a,b connecting the top 32 and bottom 33, and transverse sides 38a,b (shown in FIG. 2) also connecting the top 32 and bottom 33. The furnace 11 is heated by a plurality of quartz-halogen-tungsten bulb shaped lamps 13 which are mounted in sockets 15 attached to the top 32 of the furnace 11. A conveyor system 18 to transport items longitudinally through the furnace 11 is located below the lamps 13. An arrow 39 (shown in FIG. 2) illustrates the direction of movement of the conveyor system 18 through the furnace 11. The conveyor system 18 has two parallel stainless steel chains 21a,b connected laterally by stainless steel cross-pieces 22. The chains 21a,b are disposed in hoods 26a,b along the longitudinal sides 36a,b of the furnace 11. Interposed between the lamps 13 and the conveyor system 18 are a solid particulate barrier 23 and a perforated plate 27, both of which are permeable by infrared radiation. The solid particulate barrier 23 and the perforated plate 27 are connected by side walls 16 so as to create a volume 90 within the furnace 11 between the barrier 23 and the plate 27. The volume 90 serves as a gas distribution chamber, or plenum, into which a non-reactive gas, such as nitrogen, is introduced via a gas delivery line 25. The gas passes through perforations 29 in the perforated plate 27 and out of the furnace 11 through exhaust ducts 31 located below the conveyor chains 21a,b in the covered spaces 26a,b. Thus, the volume of the furnace below the particulate barrier 23 forms a clean internal environment 34.

The lamps 13 are organized into a plurality of lamp arrays, one of which is shown in FIG. 3 as a lamp array 12. The lamp array 12 is comprised of sixty, 250 watt quartz-halogen-tungsten lamps 13. As shown in FIG. 2 the furnace 11 preferably has sever such lamp arrays 12a–g. Each lamp array 12a–g heats an area below each lamp array, the area being substantially similar in dimension to that of the lamp array. This area may be referred to as a heat zone 14, with the furnace 11 therefore having seven heat zones 14a–g corresponding to the seven lamp arrays 12a–g.

The conveyor cross-pieces 22 are driven longitudinally through the furnace 11 and heat zones 14a–g by the stainless steel chains 21a,b, thereby transporting items, or moieties, placed on the cross-pieces 22 through the heat zones 14a–g. In a preferred embodiment, the conveyor system 18 does not provide transport through the heat zones 14a–g on a continuous basis. Instead the conveyor system 18 moves intermittently utilizing indexed, or stepwise, motion. For example, the conveyor system 18 quickly moves a moiety into a heat zone 14c and then stops for a period of time, such as one minute. After the period of time has expired the conveyor system 18 will move the moiety into a second heat zone 14d, and move a second moiety into the heat zone 14c.

Coupled to the furnace 11 are first and second micro-environments 44, 46. The first and second micro-environments 44,46 couple the furnace 11 to a closed clean environment (not shown) in which various processes and procedures are performed on the moeities, such as adding a layer of dielectric organic material to the moiety. Moieties are moved by mechanical means from the first micro-environment 44 and placed on the cross-pieces 22. The mechanical means may be a robotic arm or other device. Cut outs 24 in cross-pieces 22 provide access to the mechanical means to load the moieties on the conveyor system 18. Beneficially, this placement of the moieties occurs while the conveyor system 18 is stopped. Once a moiety has passed through the heat zones 14a–g the moiety is removed from the cross-pieces 22 by mechanical means and placed in the second micro-environment 46. A cooling zone, not shown, could be disposed between heat. zone 14g and microenvironment 46. The operation of the mechanical means may be triggered by a cessation of movement of the conveyor system 18, by timing mechanisms taking into account the period of time when the conveyor system 18 is stopped, or by other means.

Raised barriers 30 (depicted in FIG. 2) are mounted on the cross-pieces 22 perpendicular to the direction of movement of conveyor system 18. The spacing between cross-pieces 22 approximates the length of each heat zone 14 in order to reduce heating effects within a specified heat zone from adjacent heat zones. Thus, whenever the conveyor system 18 is not moving, the barriers 30 are positioned between heat zones. The raised barriers 30 reduce the flow of heated gas from one heat zone to another and also reduce the amount of radiated energy received from lamps 13 heating adjacent heat zones.

As shown in FIG. 1, sockets 15 adapted to receive the lamps 13 are mounted on the top 32 of the furnace 11. Insulation material 17 is also mounted near the top 32 of the furnace 11. The insulation material 17 is placed so as to allow the lamps 13 to heat the heat zones 14 as well as to allow the sockets 15 to receive the lamps 13. The insulation material 17, lamps 13 and sockets 15 are all sources of furnace contamination. Particles of the insulation material 17 can loosen and become separated from the bulk of the insulation material over time and fall, due to gravity, onto materials in the heat zones 14a–g. When the lamps 13 are inserted into the sockets 15 the frictional contact between lamp 13 and socket 15 creates a force which may detach minute particles from the contacting surfaces. These particles can also, over time, contaminate the heat zones 14a–g.

Therefore the particulate barrier 23 is interposed between the insulation material 17, lamps 13, and sockets 15 and the heat zones 14a–g. The particulate barrier 23, and the perforated plate 27, are of fused quartz or other material which allows for the passage of IR radiation and is capable of resisting high temperatures. Beneficially, the coefficient of thermal expansion of the material should be substantially linear over the possible range of operating temperatures of the furnace so as to minimize changes to the effects of lamp operation due to expansion of the material. It is possible for the material to be non-permeable to long-wavelength IR radiation as moiety heating may be accomplished with short-wavelength IR radiation only, and doing so may allow for increased ease in determining the state of the furnace or of the moiety, as will be later described. Corning Glass 1737F may therefore be appropriate to use as the particulate barrier 23.

The particulate barrier 23 forms the upper surface of the clean internal environment 34, and thereby separates the insulation material 17, lamps 13, and sockets 15 from the internal environment 34. In a preferred embodiment the upper part of furnace 11 is constructed from a number of separate modules joined by connecting tunnels 41, as shown in FIG. 6. Each module has a separate array of lamps 13, a barrier 23, and a plate 27 that define one of the heat zones. Conveyor system 18 runs underneath the full length of the interconnected modules to transport the moeities from heat zone to heat zone.

Returning to FIG. 1, to further reduce the possibility of particles contaminating materials on the conveyor system 18 a non-corrosive gas, such as nitrogen, is introduced into the volume, or plenum, between the particulate barrier 23 and the perforated barrier 27 via the stainless steel gas delivery line 25, which contains stainless steel filters 42. The gas, which forms the atmosphere of the internal environment 34, can also be hydrogen or any mixture of noncorrosive gases. The nitrogen is then removed from the furnace 11 via the exhaust ducts 31 located below the conveyor chains 21a,b. The gas delivery line 25 and the exhaust ducts 31 are coupled to a pressure and/or vacuum pump 50 (shown in FIG. 2) which causes the described gas flow. The flow of the nitrogen from the top of the furnace 11 to the bottom of the furnace 11 prevents particles from sources below the heat zones 14 from rising into and thereby contaminating the heat zones 14. By removing the gas via the exhaust ducts 31 any particles generated by the friction due to the motion of the chains 21a,b are directly removed from the internal environment 34 through exhaust ducts 31. The flow of gas through the furnace 11 is illustrated in more detail in FIG. 1A. After the gas passes through the perforated barrier 27, it flows laterally across the conveyor system 18 toward sides 36a,b and is coupled to the interior of hoods 26a,b by openings 47a,b. In hoods 26a,b the gas flows around baffles 49a,b and chains 21a,b into exhaust ducts 31. The flow conditions, i.e., pressure, flow rate, and surface contour, are such that the described gas flow is laminar and unidirectional.

In the preferred embodiment shown in FIG. 6 gas is introduced by gas delivery lines 25 between each particulate barrier 23 and perforated plate 27. The flow of the nitrogen over the moieties also serves to heat the moieties by convection. Thus, the furnace 11 operates both in direct radiation and forced convection modes simultaneously.

The perforated barrier 27 further ensures that a downward flow of the nitrogen occurs. As may be seen in FIG. 4 the perforated barrier 27 has a plurality of laser drilled holes 29 through which gas may pass. In one embodiment the holes 29 have a diameter of 3/32", and are arranged so that the centers of the holes 29 form columns and rows separated by 0.88". The plurality of holes 29 allows for an essentially laminar downward flow of nitrogen over time and distance. Thus, the particulate barrier 23 serves to prevent particulate contamination from above the particulate barrier 23 from contaminating the heat zones 14a–g and the nitrogen gas flow prevents particulate matter from rising from below the conveyor system 18 and contaminating the heat zones 14a–g. As an additional measure, the cross-pieces 22 are passivated, i.e., placed in an acid solution to remove oxidation, prior to installation in the furnace 11.

FIG. 3 shows details of the lamp array 12 used to heat each of the heat zones 14a–g. The lamp array 12 shown is comprised of sixty, 250 watt lamps 13. The number of lamps 13 and their geometric pattern need not be as shown, it being possible to heat the heat zones 14a–g with differing numbers of lamps 13 and different geometries of lamp placement. The lamps 13 are divided into four separately controllable lamp groups 55, 57, 59, 61. The purpose of the four separately controllable lamp groups 55, 57, 59, 61 is to uniformly heat the moiety. The lamp groups 55, 57, 59, 61, therefore, are so arranged to take into account the geometry of the moiety to be heated, which is of a generally square shape. The first lamp group 55 is comprised of the corner lamps as the corners of the moiety heat to a greater extent than the rest of the moiety due to the larger surface area by which to receive heat radiation. The second lamp group 57 is comprised of the remaining lamps with the exception of the side lamps and the center lamps. The third lamp group 59 is comprised of the center lamps. The center of the moiety receives the least heating due to the greater distance from the edges of the moiety surface. The fourth lamp group 61 is comprised of the side lamps. The sides of the moiety are also apt to receive greater heating due to a larger surface area.

The four lamp groups 55, 57, 59, 61 are separately controllable. The lamps are controlled so as to uniformly heat the surface of the moiety, it being preferred that the temperature gradient across the moiety not exceed 2.5° C. The radiation output of each lamp group is varied via duty cycle processing. That is each lamp group will be turned on only for that portion of a 60 Hz electrical cycle as required to provide uniform heating of the moiety. Other methods could also be used to control lamp output, such as controlling voltage input to the lamps 13 or other well known methods.

The surface temperature of a moiety in a heat zone 14 is determined by non-contact infrared sensors 63, 65, 67; there being three such sensors for each heat zone. The sensors 63, 65, 67 detect infrared emissions from the surface of the moiety, from which the surface temperature of the moiety may be calculated. The sensors 63, 65, 67 are mounted to the top of the furnace 11. The first sensor 63 is positioned near the center of a lamp array 12, and aimed so as to detect emissions from the center of a moiety in the heat zone below. The second sensor 65 is positioned approximately halfway between the center and one edge of a lamp array 12, and aimed so as to detect emissions from an area approximately halfway between the center and one edge of a moiety in the heat zone below. The third sensor 67 is positioned near one corner of the lamp array 12, and aimed so as to detect emissions from one corner of a moiety in the heat zone below. As the particulate barrier 23 and the perforated plate 27 may distort the sensor readings each sensor is provided with a colliminator 71, as may be seen in FIG. 1. In a preferred embodiment the colliminators 71 are stainless steel tubes which extend from the sensors 63, 65, 67 through holes drilled in the particulate barrier 23 and the perforated plate 27. Additionally, the colliminators 71 eliminate scattering effects of radiation reflected off of surfaces other than the surface area of the moiety from which a reading is desired.

Figure 7:
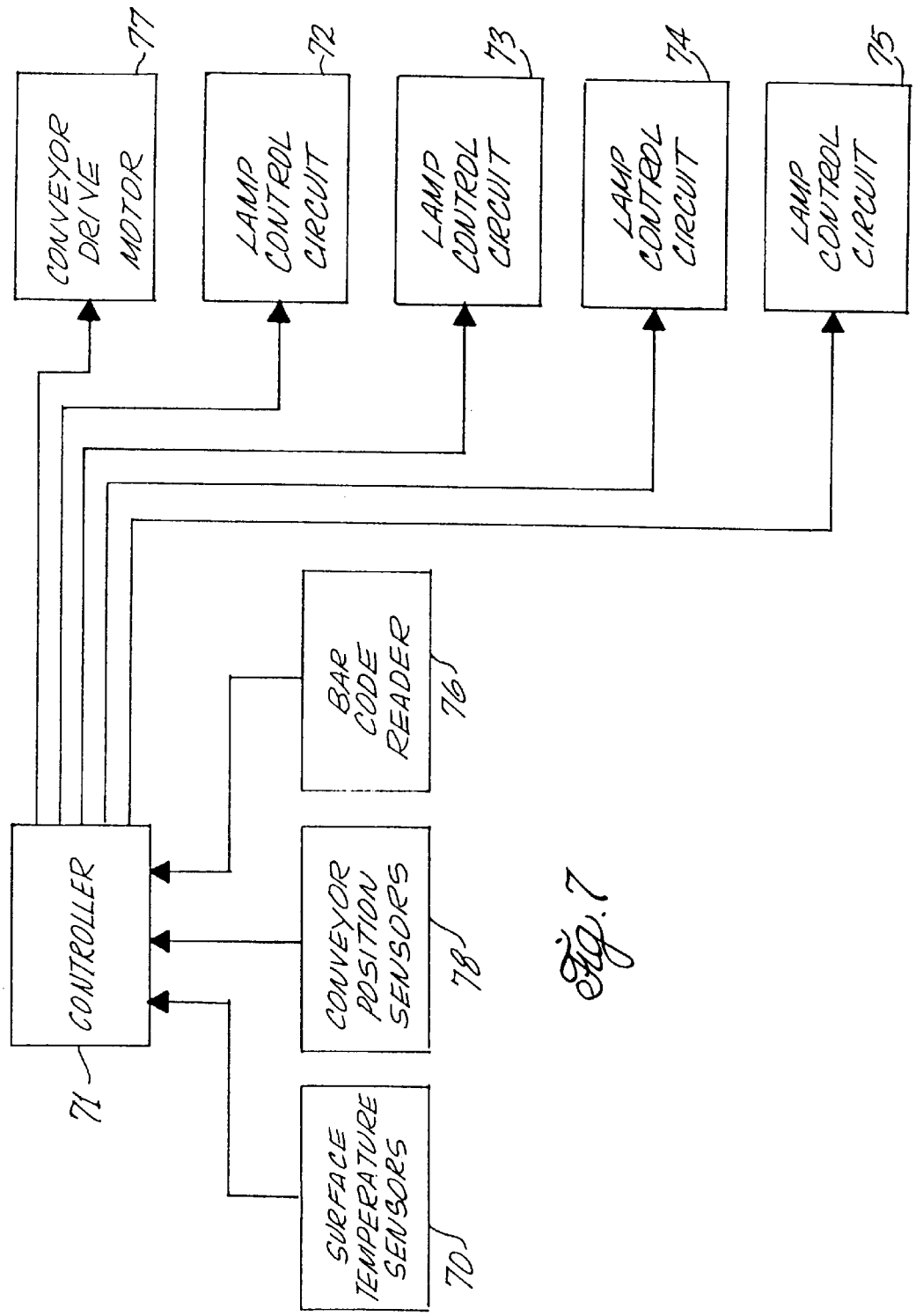
FIG. 7 is a schematic diagram of the process control apparatus.

As the moiety and the lamp arrays 12 are substantially symmetrical, data from a sensor 67 at one corner should be a valid approximation, within reasonable error, of the state of the moiety at the other corners. As represented in FIG. 7, data from the surface temperature sensors shown collectively as a block 70 is input to a controller 71. The controller utilizes the data to determine what percentage of a duty cycle the lamps 13 in the various lamp groups 55, 57, 59, 61 are to be activated and sends control signals to lamp control circuits 72, 73, 74, and 75. For example, the percentage of a duty cycle the lamps 13 in lamp group one 55, the corner lamps, are to be activated may be dependant directly on the current temperature reading from the corner sensor 67. More sophisticated control algorithms, however, are possible. The control algorithm may also take into account previous readings from the sensor 67 to take into account the rate at which the temperature of the moiety is changing, and the acceleration or deceleration of that rate. The control algorithm may also take into account readings from other sensors 63, 65 to maintain a minimum temperature gradient across the moiety, as well as to determine the extent of heat migration from and to other sections of the moiety.

Other methods and devices could be used in place of sensors 63, 65, 67. For example, a test moiety with thermocouples attached could, on a periodic basis, be conveyed through the heating zones 14 and the data from the thermocouples analyzed so as to provide optimum duty cycle control. Such a method, however, does not account for furnace heating profile changes over time and does not allow for the ability to modify heating requirements on a per moiety basis.

The controller need not be limited to controlling lamps 13 so as to maintain a substantially uniform temperature across the surface of a moiety. In maintaining a minimum temperature gradient it is possible that a specific moiety will be subjected to +a less than optimal temperature in a heat zone, and thereby be under cured. It is also possible that the specific moiety will be subjected to a greater than optimal temperature, and thereby be over cured. The level of cure may be determined through the use of Fourier transform IR instrumentation. For either an under cure or an over cure situation the controller can respond to such variations by subjecting the moiety to differing temperatures in subsequent heat zones 14. Moreover, a moiety may be tracked by the controller 71 as the moiety undergoes multiple passages through the furnace 11. One method of tracking the moieties is to place bar code registration information on the side or bottom of the moiety and to have bar code reading means, for example, in the first micro environment 44 to inform the controller of the identity of the moiety prior to the moiety passing through the furnace 11. To this end, a bar code reader 76 is coupled to controller 71 in FIG. 7. Such a tracking method allows the controller to adequately cure moieties due to variations in curing through successive passages of the moiety through the furnace 11. Therefore, if a uniform production rate of moieties is desired, the conveyor system 18 may operate at a uniform rate while the controller ensures proper curing.

Controller 71 also controls a conveyor drive motor 77 with input from conveyor position sensors collectively shown as a block 78. As mentioned above, drive motor 77 preferably operates intermittently so each moiety on the conveyor system 18 moves into a heat zone and then stops there for a prescribed dwell time, before it moves on to the next heat zone.

Controller 71 could be part of a larger controller that supervises the operation of an entire manufacturing process, including the robots in microenvironments 44 and 46.

Although the invention has been described in certain specific embodiments, many additional modifications, substitutions, and variations will be apparent to those skilled in the art. It is therefore to be understood that this invention may be practiced otherwise than is specifically described. Therefore the present embodiments of the invention should be considered in all respects as illustrative and not restrictive, the scope of the invention to be indicated by the following claims rather than the foregoing description.

We claim:

1. A method for processing moieties comprising the steps of:

receiving a plurality of moieties in a first clean area;

transferring the moieties from the first clean area to a conveyor system operatively coupled to the first clean area;

conveying the moieties on the conveyor system through a plurality of heating zones;

energizing a plurality of separately controllable heating elements in each heating zone to apply heat to the moieties;

interposing a particulate barrier permeable to near infrared radiation between the heating elements and the conveyor system; and transferring the moieties from the conveyor system to a second clean area operatively coupled to the conveyor system.

2. A method for processing moieties comprising the steps of:

transporting a plurality of moieties on a conveyor through a heating zone one moiety at a time;

energizing a plurality of groups of heating elements in the heating zone to transfer heat to the moiety in the heating zone;

sensing the surface temperature of the moiety in the heating zone at a plurality of locations; and individually controlling the groups of heating elements responsive to the surface temperatures sensed at the plurality of locations to minimize the surface temperature gradient across the moiety in the heating zone.

3. The method of claim 2, in which the sensing step comprises the step of aiming a plurality of infrared sensors to detect the temperature at different locations on the surface of the moiety.

4. The method of claim 2, in which the energizing step comprises the step of utilizing infrared lamps as heating elements.

5. The method of claim 4 further comprising the step of disposing an infrared permeable, particulate barrier between the conveyor and the lamps.

6. The method of claim 5 further comprising the steps of disposing an infrared permeable, perforated barrier between the conveyor and the lamps, and disposing a source of non-corrosive gas between the lamps and the perforated barrier;

wherein the disposing of the perforated barrier step comprises the step of designing the perforated barrier with holes to establish laminar flow of the gas between the barrier and the conveyor.

7. The method of claim 2, in which the transporting step comprises the step of indexing the conveyor movement through the heating zone.

8. The method of claim 6, in which the disposing of the perforated barrier step comprises the step of disposing the perforated barrier between the conveyor and the particulate barrier.

\* \* \* \* \*